(12) United States Patent
Honda

(10) Patent No.: US 6,765,274 B2
(45) Date of Patent: Jul. 20, 2004

(54) SEMICONDUCTOR DEVICE HAVING A BUILT-IN CONTACT-TYPE SENSOR AND MANUFACTURING METHOD OF SUCH A SEMICONDUCTOR DEVICE

(75) Inventor: Toshiyuki Honda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/602,674

(22) Filed: Jun. 25, 2003

(65) Prior Publication Data

US 2004/0065915 A1 Apr. 8, 2004

(30) Foreign Application Priority Data

Jul. 10, 2002 (JP) ......................................... 2002-201384

(51) Int. Cl.[7] .......................... H01L 27/14; H01L 29/82; H01L 29/84; H01L 23/495; H01L 23/02
(52) U.S. Cl. ..................... 257/414; 257/672; 257/676; 257/680
(58) Field of Search ................................ 257/414, 467, 257/672, 676, 680

(56) References Cited

U.S. PATENT DOCUMENTS

| | | | | |
|---|---|---|---|---|
| 6,399,994 B2 | * | 6/2002 | Shobu | ......................... 257/414 |
| 2002/0131001 A1 | * | 9/2002 | Raaijmakers et al. | ........ 349/139 |
| 2003/0178714 A1 | * | 9/2003 | Sakoda et al. | .............. 257/680 |

* cited by examiner

*Primary Examiner*—Ngân V. Ngô
(74) *Attorney, Agent, or Firm*—Westerman, Hattori, Daniels & Adrian, LLP

(57) ABSTRACT

A semiconductor element provided in a semiconductor device includes a built-in contact-type sensor having a sensor area formed on a circuit formation surface. Connection terminals are provided in an area other than the sensor area. A wiring board is connected to the connection terminals of the semiconductor element so that an end surface of the wiring board is positioned on the circuit formation surface. A protective resin part covers a part extending from the end surface of the wiring board to the circuit formation surface so as to protect a connection portion between the semiconductor element and the wiring board.

5 Claims, 10 Drawing Sheets

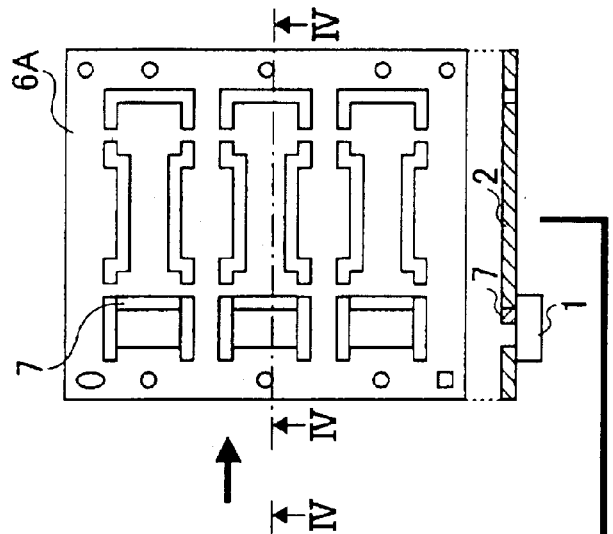
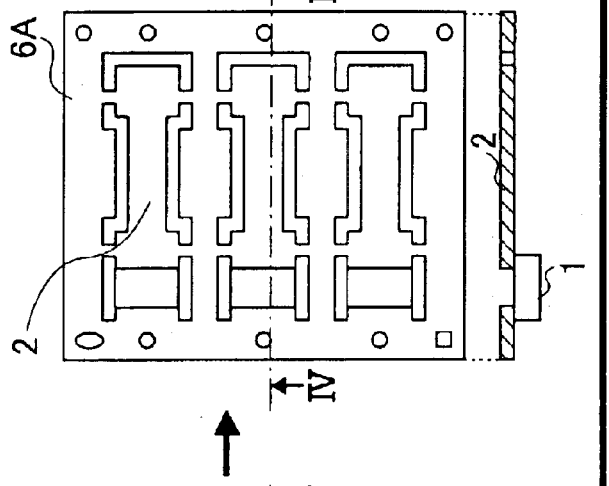
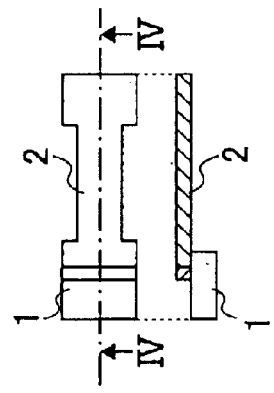

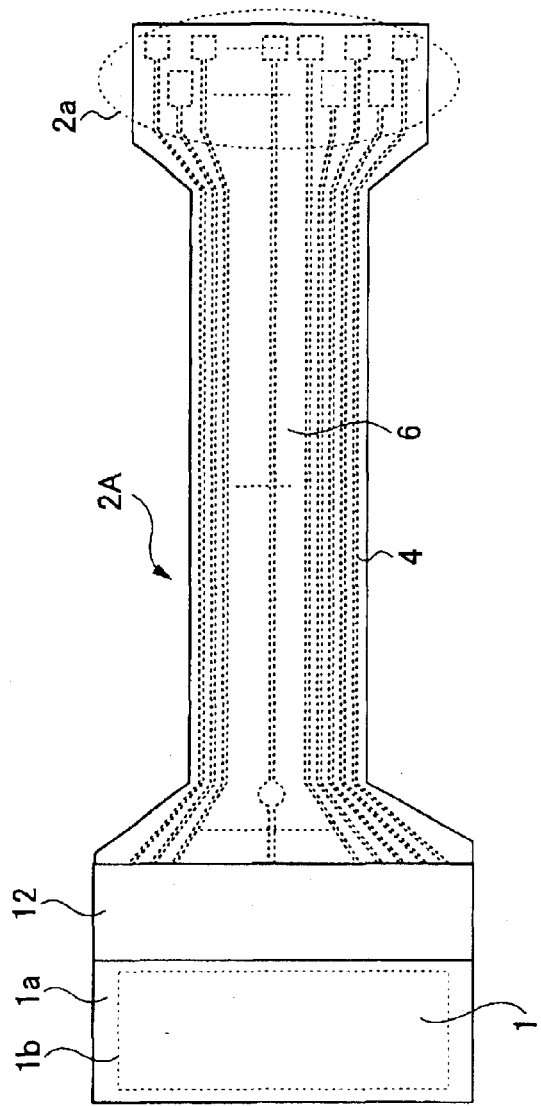
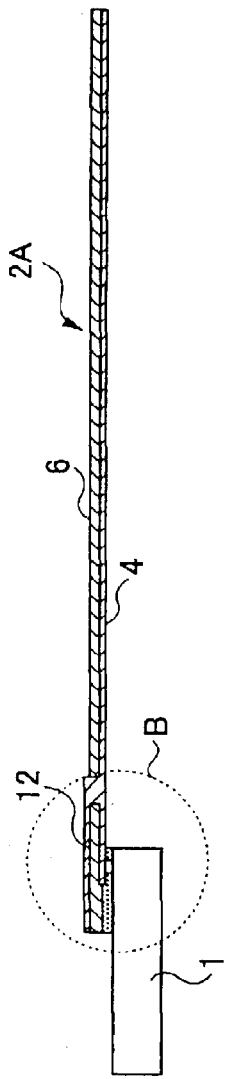
FIG.8A
FIG.8B

SEMICONDUCTOR DEVICE HAVING A BUILT-IN CONTACT-TYPE SENSOR AND MANUFACTURING METHOD OF SUCH A SEMICONDUCTOR DEVICE

CROSS-REFERENCE TO RELATED APPLICATIONS

The present application is base on Japanese priority application No. 2002-201384 filed Jul. 10, 2002, the entire contents of which are hereby incorporated by reference.

BACKGROUND OF THE INVENTION

1. Field of the Invention

The present invention generally relates to semiconductor devices and, more particularly, to a semiconductor device having a built-in contact-type sensor such as a fingerprint sensor and a manufacturing method of such a semiconductor device.

While electronic information communication spreads, the demand for individual identification has increased in electric equipment so as to observe the confidentiality of personal information. Although various technologies as means for personal identification have been developed and put into practical use, the technology for distinguishing a fingerprint has attracted attention. A semiconductor device in which a contact-type sensor using electric capacitance is incorporated as a small device for distinguishing a fingerprint has been developed.

2. Description of the Related Art

Generally, a fingerprint sensor referred to as a capacitance-type recognizes a fingerprint based on a change in the capacitance that is generated by bringing a finger tip into direct contact with a sensor surface. The fingerprint sensor called a sweep-type reads a fingerprint image by a sensor surface being swept by a finger. For example, a fingerprint image can be recognized by sensor surface being swept by a finger even if the sensor surface has a width as small as 1 mm. For this reason, the sweep-type fingerprint sensor is a mainline among fingerprint sensors that can be incorporated into portable equipment.

The electric-capacitance sensor used as a fingerprint sensor can be formed on a silicon substrate like a semiconductor element. That is, a fingerprint sensor can be produced as a part of a semiconductor chip that is formed of a silicon substrate.

FIG. 1 is a cross-sectional view of a semiconductor device having a built-in sweep-type fingerprint sensor in a state in which the semiconductor device is incorporated in a housing of an electronic device. In FIG. 1, bumps 1c of the semiconductor device 1 having a built-in fingerprint sensor is connected to a flexible board 2 through an anisotropically conductive resin 4.

The semiconductor chip 1 is incorporated in a housing 3 of an electric device in a state in which a fingerprint sensor area 1b is exposed on a circuit formation surface 1a. That is, the fingerprint sensor area 1b is exposed to outside since it is necessary to move a finger while the finger is brought into contact with the fingerprint sensor area 1b.

Since the fingerprint sensor area 1b is generally formed in the circuit formation surface 1a of the semiconductor chip 1, the fingerprint sensor area 1b is provided on the same surface as a surface on which the bumps 1c, which serve as terminals for mounting the semiconductor chip 1 to the flexible board 2, are provided. In the case of the example shown in FIG. 1, the bumps 1c that are protrudingly formed on the circuit formation surface 1a of the semiconductor chip 1 are connected and fixed to electrode pads 4a formed in the pattern wiring 4 of the flexible board 2 by an anisotropically conductive resin 5.

In the structure shown in FIG. 1, the fingerprint sensor area 1b of the semiconductor chip 1 is a part, which is directly contacted by a finger, and must be exposed outside of the housing 3 of the electric device to be incorporated.

As mentioned above, since the fingerprint sensor area 1b is a part, which is directly contacted by a finger, there may be a case in which a finger cannot be completely brought into contact with the fingerprint sensor area if the peripheral portion of the exposed part is high. Particularly in the case of a fingerprint sensor device of the sweep-type, the width (X direction of FIG. 1) of the fingerprint sensor area 1b is as small as about 1 mm, a finger may not contact sufficiently if the peripheral portion is high. Therefore, the end of the flexible board 2 is not covered by the housing 3, thereby being exposed to outside of the housing 3.

When the end of the flexible board 2 is exposed, an external force may be exerted on the end of the flexible board 2. For example, when moving a finger in an opposite direction (a direction opposite to the direction X), a force may be exerted on the end of the flexible board 2 which may cause the end of the flexible board to move upward. The end of the flexible board 2 is the connection portion to which the semiconductor chip 1 is connected, and, thus, if an upward force is exerted on the end of the flexible board 2, the end of the flexible board 2 may be separated from the semiconductor chip 1 if the bonding force of the anisotropically conductive resin 5 is small. In this case, the electric connection between the semiconductor chip 1 and the flexible board 2 is deteriorated, which may cause a problem that the fingerprint sensor does not function well.

SUMMARY OF THE INVENTION

It is a general object of the present invention to provide an improved and useful semiconductor device having a built-in contact-type sensor in which the above-mentioned problems are eliminated.

A more specific object of the present invention is to provide a semiconductor device having a built-in contact-type sensor in which a connection portion between a semiconductor element and a wiring board is protected.

In order to achieve the above-mentioned invention, there is provided according to one aspect of the present invention a semiconductor device having a built-in contact-type sensor, comprising: a semiconductor element including a built-in contact-type sensor having a sensor area formed on a circuit formation surface and connection terminals provided in an area other than the sensor area; a wiring board connected to the connection terminals of the semiconductor element so that an end surface of the wiring board is positioned on the circuit formation surface; and a protective resin part covering a part extending from the end surface of the wiring board to the circuit formation surface.

According to the present invention, the end of the wiring board is covered by the protective resin part, and is firmly fixed to the circuit formation surface of the semiconductor element. Thereby, the end of the wiring board is prevented from separating from the semiconductor element due to an external force, which prevents failure of the semiconductor device due to separation of the wiring board from the semiconductor element.

Additionally, there is provided according to another aspect of the present invention a semiconductor device having a built-in contact-type sensor, comprising: a semiconductor element including a built-in contact-type sensor having a sensor area formed on a circuit formation surface and connection terminals provided in an area other than the sensor area; a wiring board connected to the connection terminals of the semiconductor element so that an end surface of the wiring board is positioned on the circuit formation surface; and a resin filled between the wiring board and the semiconductor element and covering the end surface of the wiring board.

According to the above-mentioned invention, the end of the wiring board is covered by the resin filled between the wiring board and the semiconductor element, and is firmly fixed to the circuit formation surface of the semiconductor element. Thereby, the end of the wiring board is prevented from separating from the semiconductor element due to an external force, which prevents failure of the semiconductor device due to separation of the wiring board from the semiconductor element.

Additionally, there is provided according to another aspect of the present invention a semiconductor device having a built-in contact-type sensor, comprising: a semiconductor element including a built-in contact-type sensor having a sensor area formed on a circuit formation surface and connection terminals provided in an area other than the sensor area; and a wiring board connected to the connection terminals of the semiconductor element so that an end surface of the wiring board is positioned on the circuit formation surface, wherein the end surface of the wiring board positioned on the circuit formation surface forms an inclined surface with respect to the circuit formation surface.

According to the above-mentioned invention, the end surface of the wiring board located on the circuit formation surface of the semiconductor element inclines, and, thus, a force exerted on the inclined end surface does not act in a direction which separate the end of the wiring board from the circuit formation surface of the semiconductor element.

In the semiconductor device according to the above-mentioned invention, a conductive part may be formed in the vicinity of the oblique surface on a surface opposite to a surface of the wiring board facing the semiconductor element, and the conductive part may be electrically connected to grounding wires included in wires formed on the wiring board.

Additionally, there is provided according to one aspect of the present invention a semiconductor device having a built-in contact-type sensor, comprising: a semiconductor element including a built-in contact-type sensor having a sensor area formed on a circuit formation surface and connection terminals provided in an area other than the sensor area; and a wiring board having wires on a surface facing the semiconductor element and connected to the connection terminals of the semiconductor element so that an end surface of the wiring board is positioned on the circuit formation surface, wherein a conductive part is formed in the vicinity of the end surface of the wiring board on a surface opposite to the surface of the wiring board facing the semiconductor element, and the conductive part is electrically connected to grounding wires included in the wires formed on the wiring board.

According to the present invention, since the conductive part formed on the front surface of the end of the wiring board is connected to the grounding wire, a static charge accumulated on the fingertip flows to the grounding wire by the fingertip contacting the conductive part prior to contacting the sensor area of the semiconductor element. Thereby, the sensor area can be protected from a static charge.

Additionally, there is provided according to another aspect of the present invention a manufacturing method of the above-mentioned semiconductor device, comprising the steps of: removing a part of a base material sheet of the wiring board and forming the wiring board in the base material sheet in a state where a part of the wiring board is connected to the base material sheet; locating the semiconductor element over an end surface of the wiring board formed in the base material sheet and a part of the base material sheet other than the wiring board; connecting connection electrodes of the semiconductor element to electrodes formed on the end surface of the wiring board; and cutting a part of the wiring board connected to the base material sheet so as to separate the wiring board from the base material sheet.

Since the semiconductor element is supported by the end of the wiring board and the base material sheet until the wiring board is separated from the base material sheet, easy handling of the base material sheet can be achieved during the manufacturing process.

In the manufacturing method according to the present invention, the step of locating the semiconductor element may include a step of placing the base material sheet on a bonding stage having a first surface and a second surface, a step corresponding to a height of the connection electrodes of the semiconductor element formed between the first surface and the second surface so that the end surface of the wiring board is placed on the first surface and a part of the wiring board other than the end surface of the wiring board is placed on the second surface.

Accordingly, even when the electrode is formed only on one side of the semiconductor element, the semiconductor element can be maintained horizontally on the bonding stage when mounting the semiconductor element. Thus, bonding can be performed easily.

Other objects, features and advantages of the present invention will become more apparent from the scope of the present invention.

BRIEF DESCRIPTION OF THE DRAWINGS

FIGS. 4A–4D are illustrations for explaining a process of connecting a semiconductor chip to a flexible board so as to form a fingerprint sensor apparatus;

FIG. 8A is a plan view of a fingerprint sensor apparatus according to a third embodiment of the present invention; FIG. 8B is a cross-sectional view of the fingerprint sensor apparatus shown in FIG. 8A;

DETAILED DESCRIPTION OF THE PREFERRED EMBODIMENTS

A description will now be given, with reference to FIGS. 2A, 2B and 3, of a first embodiment of the present invention.

Figure 2A:
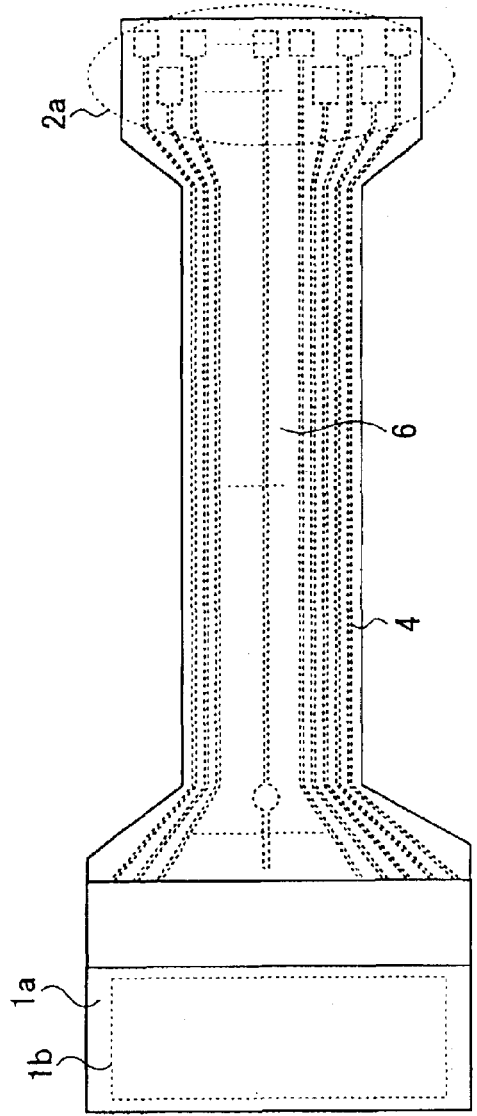
FIG. 2A is a plan view of a fingerprint sensor device according to a first embodiment of the present invention.

FIG. 2A is a plan view of a fingerprint sensor device according to the first embodiment of the present invention. FIG. 2B is a cross-sectional view of the fingerprint sensor device shown in FIG. 2A. FIG. 3 is an enlarged view of a part A in FIG. 2A.

Figure 2B:
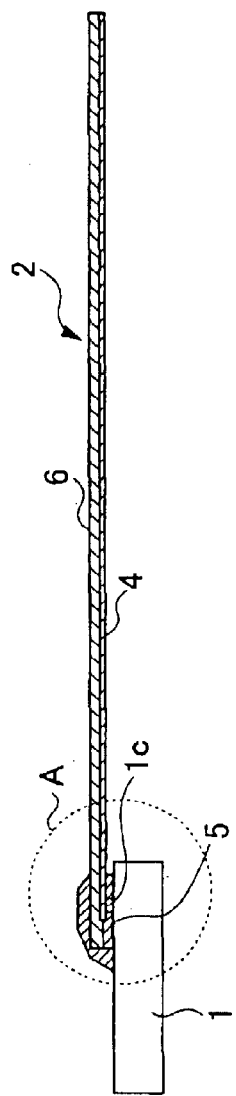
FIG. 2B is a cross-sectional view of the fingerprint sensor device shown in FIG. 2A.

The fingerprint sensor device shown in FIGS. 2A and 2B comprises a semiconductor chip 1 having a built-in fingerprint sensor and a flexible board 2. The built-in fingerprint sensor is formed as a part of the semiconductor chip 1. The flexible board 2 serves as a wiring board that connects the semiconductor chip 1 to an external circuit. A fingerprint sensor area 1b is formed in a circuit formation surface 1a of the semiconductor chip 1. Bumps 1c as connection terminals are formed in areas other than the fingerprint sensor area 1b.

The bumps 1c are connected to electrode pads (terminals) 4a formed in pattern wires 4 of the flexible board 2 via an anisotropically conductive resin 5. It should be noted that the anisotropically conductive resin 5 may be replaced by other resins such as a nonconductive paste (NCP).

The semiconductor chip 1 is incorporated into a housing of electric equipment in a state where the fingerprint sensor area 1b is exposed. That is, the fingerprint sensor area 1b must be exposed outside since the fingerprint sensor area 1b must be contacted by a finger while the finger is moved.

Since the fingerprint sensor area 1b is formed in the circuit formation surface 1a of the semiconductor chip 1, the finger sensor area 1b is provided on the same surface as the surface on which the bumps 1c, which serve as mounting terminals for mounting the semiconductor chip 1 onto the flexible board 2, are provided.

In the case of the example shown in FIG. 2, the bumps 1c, which are protrudingly formed on the circuit formation surface 1a of the semiconductor chip 1, are connected to the electrode pads 4a formed in the pattern wires 4 of the flexible board 2, and are bonded and fixed to the electrode pads 4a by the anisotropically conductive resin 5.

The flexible board 2 is formed by attaching a copper foil to an insulating base material 6 such as a polyimide film and patterning the copper foil so as to form the pattern wires 4 and the electrode pads 4a. The semiconductor chip 1 is mounted to one end of the flexible board 2, and connector connection part 2a to an external circuit is formed on the other end of the flexible board 2.

The thus-constructed fingerprint sensor device is incorporated into a housing of electronic equipment in a state where the fingerprint sensor area 1b of the semiconductor chip 1 is exposed from the housing, and is connected to an internal circuit of the electronic equipment through the flexible board 2. In such a structure, the end of the flexible board 2 connected to the semiconductor chip 1 as mentioned above is also exposed from the housing of the electronic equipment.

In the present embodiment, a protective resin is applied to the exposed end of the flexible board 2 so that a protective resin part 7 is formed. The protective resin is made of a liquefied epoxy resin, and is applied to the flexible board 2 so as to cover an end surface 6a of the base material 6 and a part of a surface near the end surface 6a. Therefore, the end surface 6a of the base material 6 of the flexible board 2 is protected by the protective resin part 7, and, thus, an external force cannot be applied to the end surface 6a of the base material 6.

As mentioned above, in the present embodiment, when a finger is brought into contact with the fingerprint sensor area 1b, since the exposed end of the flexible board 2 is protected by the protective resin part 7, an external force cannot be applied to the end of the flexible board 2, thereby preventing separation of the flexible board 2 from the semiconductor chip 1. Therefore, deterioration of the electric connection due to exfoliation of the end of the flexible board can be prevented, and the normal function of the fingerprint sensor can be maintained for a long time.

A description will now be given, with reference to FIGS. 4A–4D, 5A, 5B and 6, of a manufacturing method of the above-mentioned fingerprint sensor apparatus.

Figure 5A:
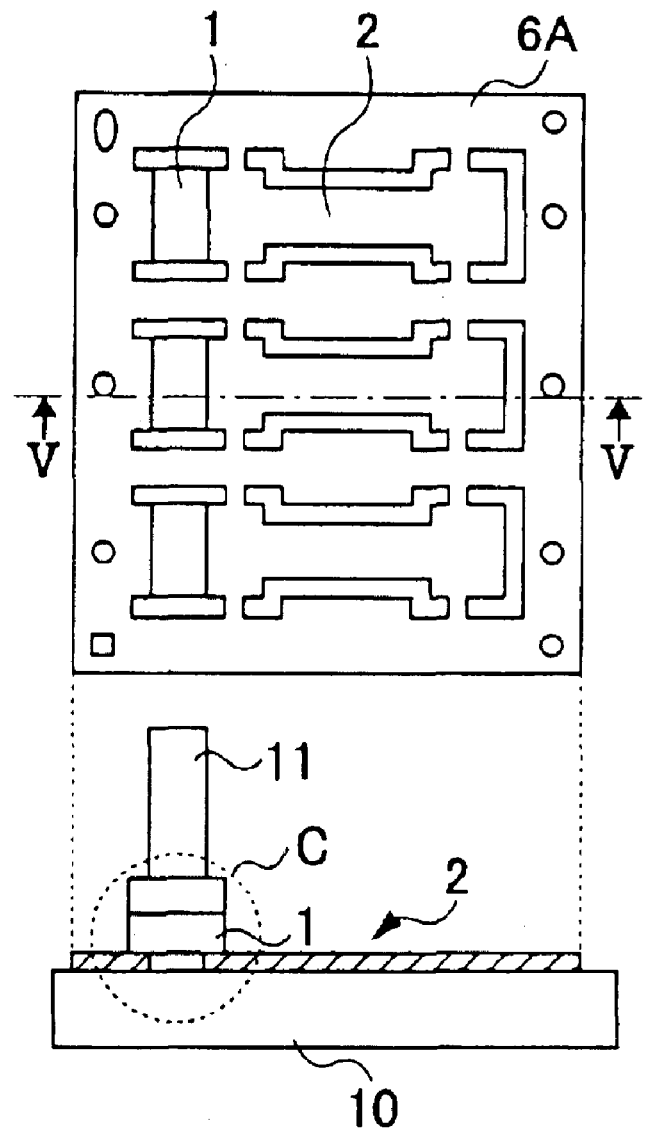
FIG. 5A is a plan view of a base material sheet in which the flexible boards are formed.
Figure 5B:
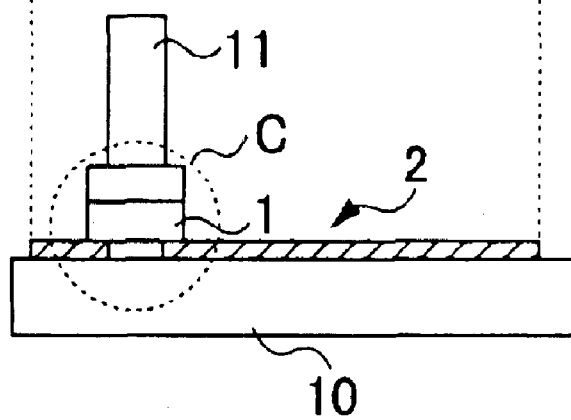
FIG. 5B is a side view of a cutting tool used in a cutting step shown in FIG. 4D.
Figure 6:
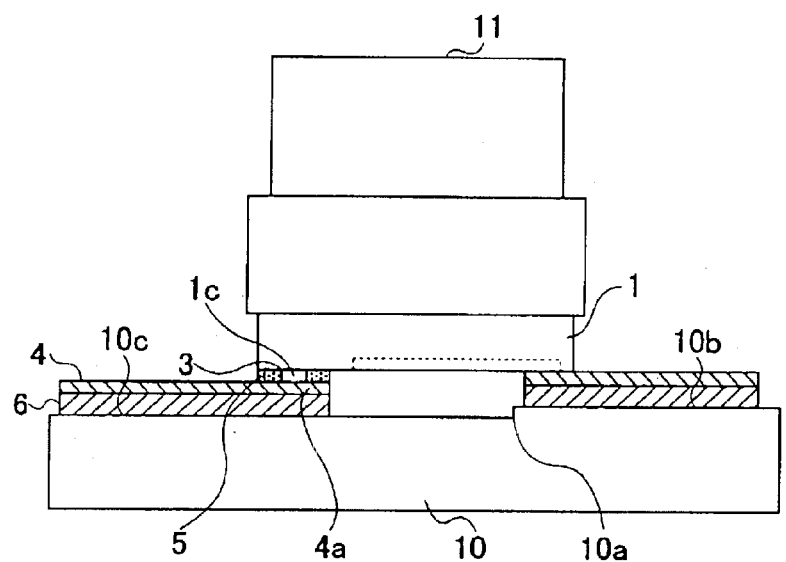
FIG. 6 is an enlarged view of a part C encircled by a dotted circle in FIG. 5B.

FIGS. 4A–4D are illustrations for explaining a process of connecting the semiconductor chip 1 to the flexible board 2 so as to form the fingerprint sensor apparatus. FIG. 5A is a plan view of a base material sheet in which the flexible boards 2 are formed, and FIG. 5B is a side view of a cutting tool used in the cutting step shown in FIG. 4D. FIG. 6 is an enlarged view of a part C encircled by a dotted circle in FIG. 5B. It should be noted that, in each of FIGS. 4A–4D, a plan view of the base material sheet is shown in an upper part and a cross-sectional view taken along a line IV—IV in the plan view is shown in a lower part. Additionally, a cross-sectional view taken along a line V—V of FIG. 5A is shown in FIG. 5B.

In the manufacturing process shown in FIGS. 4A–4D, three flexible boards 2 are produced from a base material sheet 6A. First, as shown in FIG. 4A, the base material sheet 6A is patternized by press working or etching so as to form an outline configuration of the flexible boards 2. At this stage, the three flexible boards 2 are partially connected with the base material sheet 6A.

Next, as shown in FIG. 4B, the semiconductor chip 1 is connected to each of the three flexible boards 2. At this time, the base material sheet 6A is placed on a bonding stage 10 as shown in FIG. 5 and FIG. 6, and the semiconductor chip 1 is placed on the base material sheet 6A in a state where the bumps 1c of each semiconductor chip 1 are in contact with the corresponding electrode pads 4a. Then, a bonding tool 11 is pressed against the back surface of each semiconductor chip 1 so as to join the bumps 1c to the electrode pads 4a. At this time, the anisotropically conductive resin 5 is filled between each semiconductor chip 1 and each flexible board 2 so as to bond the flexible board 2 to the semiconductor chip 1, which improves reliability of joining.

In the above-mentioned process, the semiconductor chip 1 may incline since the bumps 1c are provided on only one side of the semiconductor chip 1. Thus, the surface of the bonding stage 10 on which surface the semiconductor chip 1 is placed is not a flat surface but is provided with a step 10a so that a part 10b of the surface of the bonding stage 10 corresponding to the side of the semiconductor chip 1 which is not provided with the bumps 1c is higher than a part 10c of the surface of the bonding stage 10 by the height of the bumps 1c. Thereby, each semiconductor chip 1 is positioned parallel to the bottom surface of the bonding tool 11, which achieves reliable bonding.

Next, as shown in FIG. 4C, a protective resin is applied to the end of each flexible board 2 which end is connected to the semiconductor chip 1 so as to form the protective resin part 7. When applying the protective resin, it is necessary to apply an appropriate amount of the protective resin so that protective resin sufficiently covers the end of the flexible board 2 but does not cover the fingerprint sensor area 1b of the semiconductor chip 1. After curing the protective resin, the parts by which each flexible board 2 are connected to the base material sheet 6A are cut so as to separate each flexible board 2 from the base material sheet 6A, and the fingerprint sensor apparatus is completed as shown in FIG. 4D.

Figure 7:
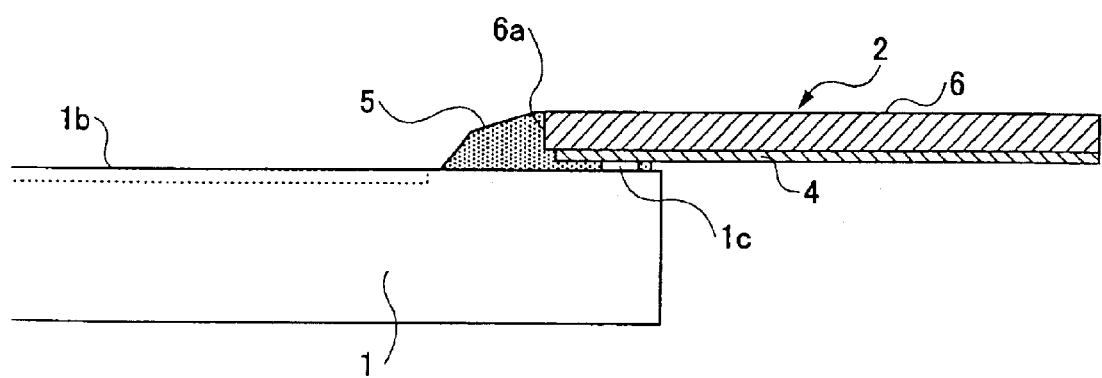
FIG. 7 is an enlarged side view of a part of a fingerprint sensor apparatus according to a second embodiment of the present invention.

A description will now be given, with reference to FIG. 7, of a second embodiment of the present invention. FIG. 7 is an enlarged side view of a part of the fingerprint sensor apparatus according to the second embodiment of the present invention. In FIG. 7, parts that are the same as the parts shown in FIG. 3 are given the same reference numerals, and descriptions thereof will be omitted.

In the second embodiment of the present invention, an amount of the anisotropically conductive resin 5 to be filled is increased instead of forming the protective resin part 7 in the above-mentioned first embodiment so as to intentionally cause protrusion of the anisotropically conductive resin 5. That is, an amount of the anisotropically conductive resin 5 to be filled between the semiconductor chip 1 and the flexible board 2 when connecting the semiconductor chip 1 to the flexible board 2 so that the anisotropically conductive resin 5 protrudes to cover an end surface 6a of the base material 6 of the flexible sheet 2. Thereby, the end part of the flexible board 2 is reinforced by the anisotropically conductive resin 5, which prevents the end part of the flexible board 2 from separating from the semiconductor chip 1.

Figure 1:
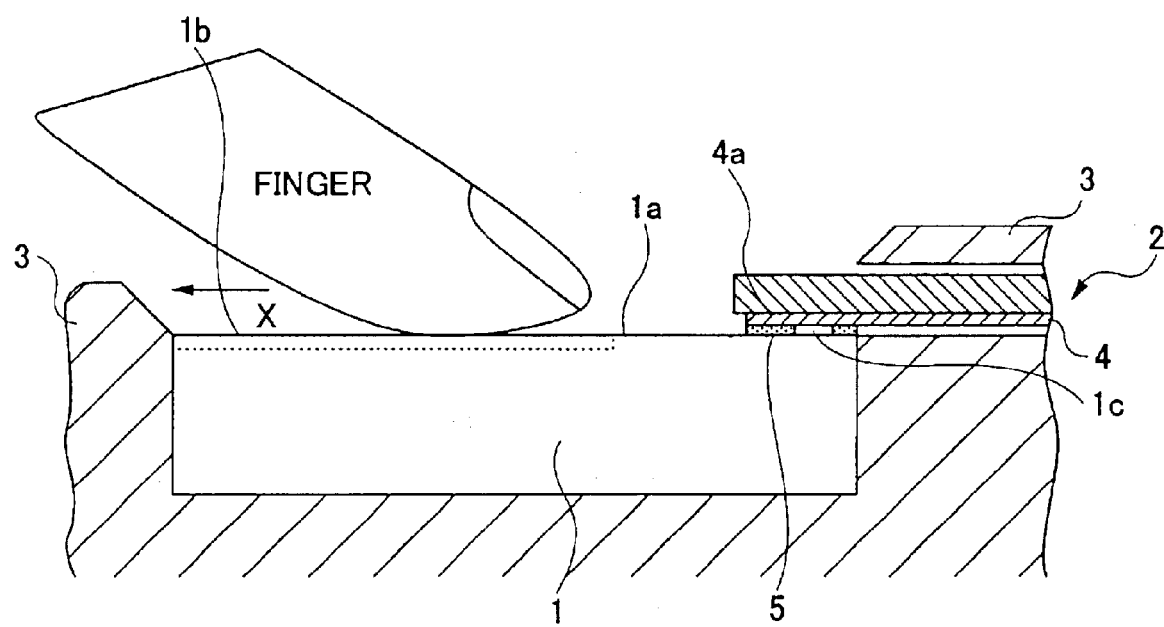
FIG. 1 is a cross-sectional view of a semiconductor device having a built-in sweep-type fingerprint sensor in a state in which the semiconductor device is incorporated in a housing of an electronic device.
Figure 9:
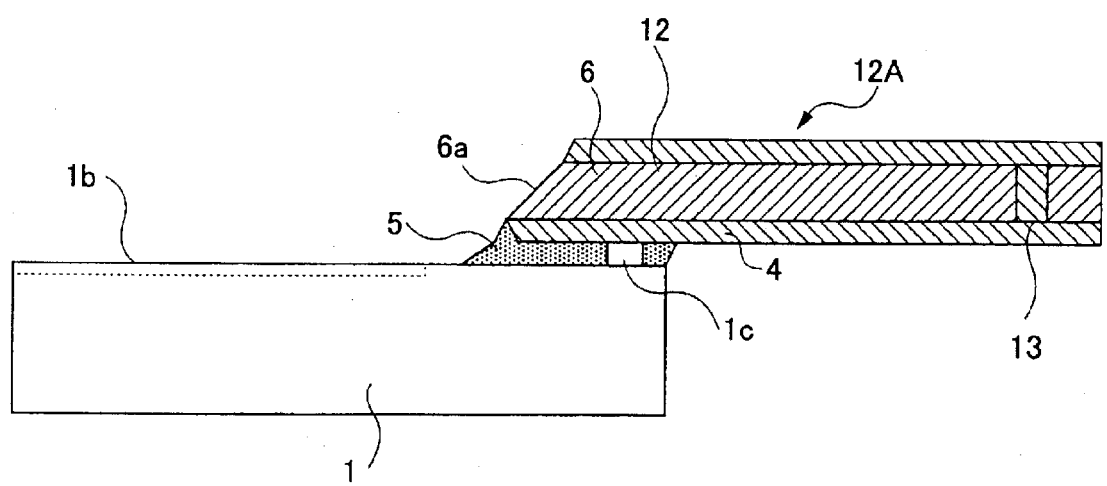
FIG. 9 is an enlarged view of a part B encircled by a dotted circle of FIG. 8B.
Figure 10:
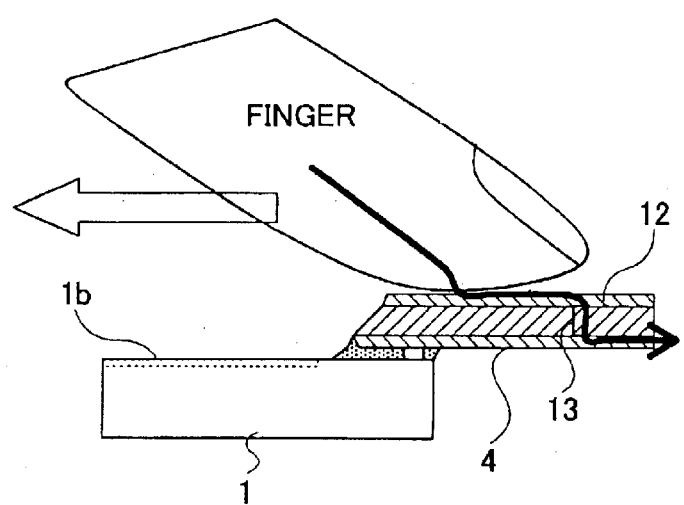
FIG. 10 is an illustration for explaining removal of a static charge of a fingertip.

A description will now be given, with reference to FIGS. 8A through 10, of a fingerprint sensor apparatus according to a third embodiment of the present invention. FIG. 8A is a plan view of the fingerprint sensor apparatus according to the third embodiment of the present invention, and FIG. 8B is a cross-sectional view of the fingerprint sensor apparatus shown in FIG. 8A. FIG. 9 is an enlarged view of a part B encircled by a dotted circle of FIG. 8A. FIG. 10 is an illustration for explaining removal of a static charge of a fingertip. In FIGS. 8A through 10, parts that are the same as the parts shown in FIGS. 1 and 3 are given the same reference numerals, and descriptions thereof will be omitted.

Similar to the fingerprint sensor apparatus shown in FIG. 2, the fingerprint sensor apparatus according to the third embodiment of the present invention has the semiconductor chip 1 and a flexible board 2A connected to the semiconductor chip 1. The flexible board 2A is formed by adding a grounding conductive part 12 to the above-mentioned flexible board 2. That is, the grounding conductive part 12 is formed on the surface of the base material 6 so as to cover the end part of the flexible board 2 on the side of the semiconductor chip 1. The grounding conductive part 12 is provided on a surface opposite to the pattern wires 4, and is connected to grounding wires of the pattern wires 4 via a through hole 13. Therefore., the grounding conductive part 12 is grounded through the pattern wires 4.

When a finger is brought into contact with the fingerprint sensor area 1b, a part in which the grounding conductive part 12 is formed is first contacted by the finger. Therefore, since a fingertip is electrically connected to the grounding part of the electronic equipment instantaneously through the through hole 13 and the pattern wires 4 at the time the fingertip contacts the grounding conductive part 12, a static charge accumulated on the fingertip flows to the grounding part of the electronic equipment. Thereby, the static charge is removed before the fingertip contacts the fingerprint sensor area 1b, which prevents the static charge from acting on the fingerprint sensor area 1b. Although the fingerprint sensor generally uses a capacitive sensor and an influence of the static charge is particularly concerned, an erroneous operation of the fingerprint sensor or damage to the fingerprint sensor due to a static charge can be prevented by removing the static charge as is in the present embodiment.

Figure 3:
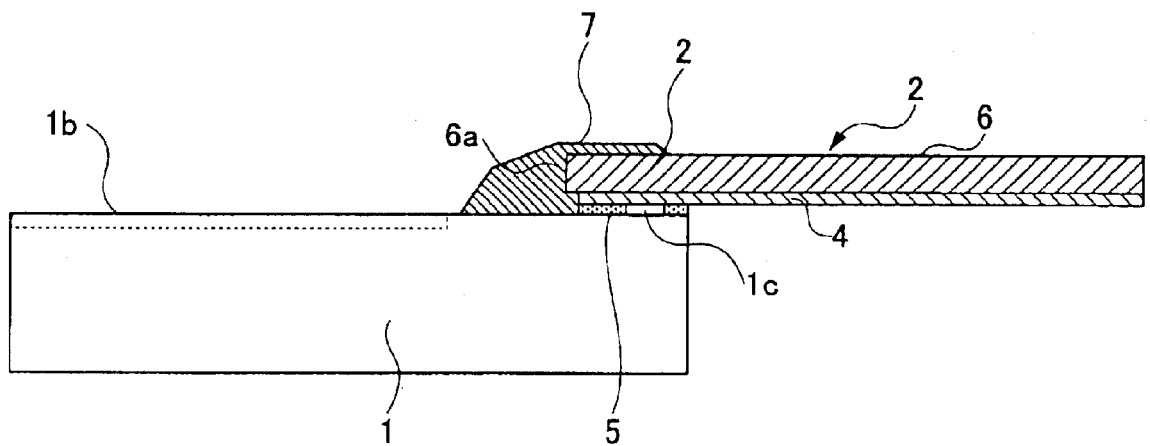
FIG. 3 is an enlarged view of a part A in FIG. 2A.

In the present embodiment, since the grounding conductive part 12 is provided on the semiconductor chip side of the flexible board 2A, the protective resin part 7 as shown in FIG. 3 cannot be formed. Thus, by inclining the end (end surface) of the flexible board 2A as shown in FIG. 9, it can be constituted that a force which may separate the flexible board 2 from the semiconductor chip 1 is not exerted on the end of the flexible board 2.

That is, a fingertip is caused to hardly catch the end of the flexible board by inclining the end surface 6a of the base material 6 of the flexible board 2A by making the end surface not to be perpendicular but to be inclined with respect to the circuit formation surface 1a of the semiconductor chip 1, thereby causing the end part of the flexible board 2 always being pressed toward the semiconductor chip when the fingertip is brought into contact.

As a processing method for providing an inclination to the end surface of the base material 6, there is a method of processing the base material 6 by etching from the side of the grounding conductive part 12. That is, the inclined end surface 6a is naturally formed by removing a part of the base material 6 by contacting the base material 6 with an etching liquid from the side of the grounding conductive part 12. However, as for the pattern wire 4, it is preferable by etching from an opposite side to provide an inclination reverse to the inclination of the end surface 6a. According to such a structure, the anisotropically conductive resin 5 is filled up to a boundary between the base material 6 and the pattern wire 4, which prevents the lower edge of the flexible board 2A from protruding.

As mentioned above, in the present embodiment, separation of the flexible board is prevented by providing an inclination at the end of the flexible board, and a static charge of a fingertip is effectively removed by forming the grounding conductive part on the front surface of the flexible board at the end thereof.

Figure 11:
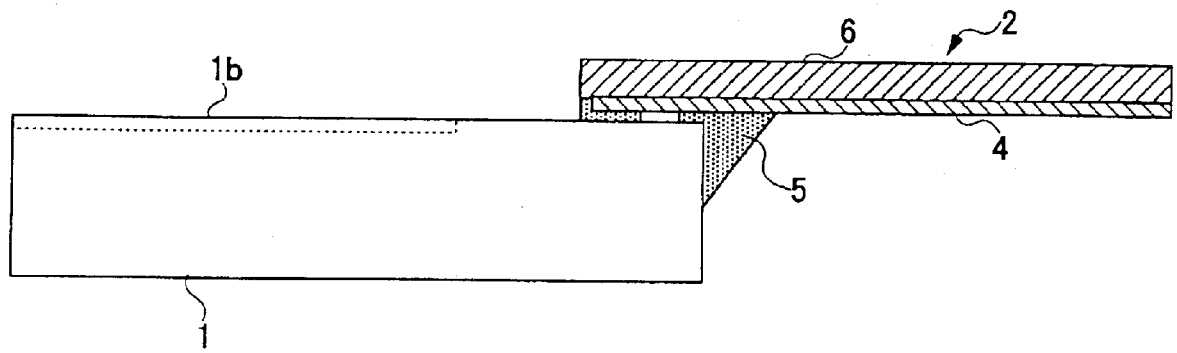
FIG. 11 is a side view of a fillet configuration part formed by an anisotropically conductive resin at a corner between a flexible board and a semiconductor chip.
Figure 12:
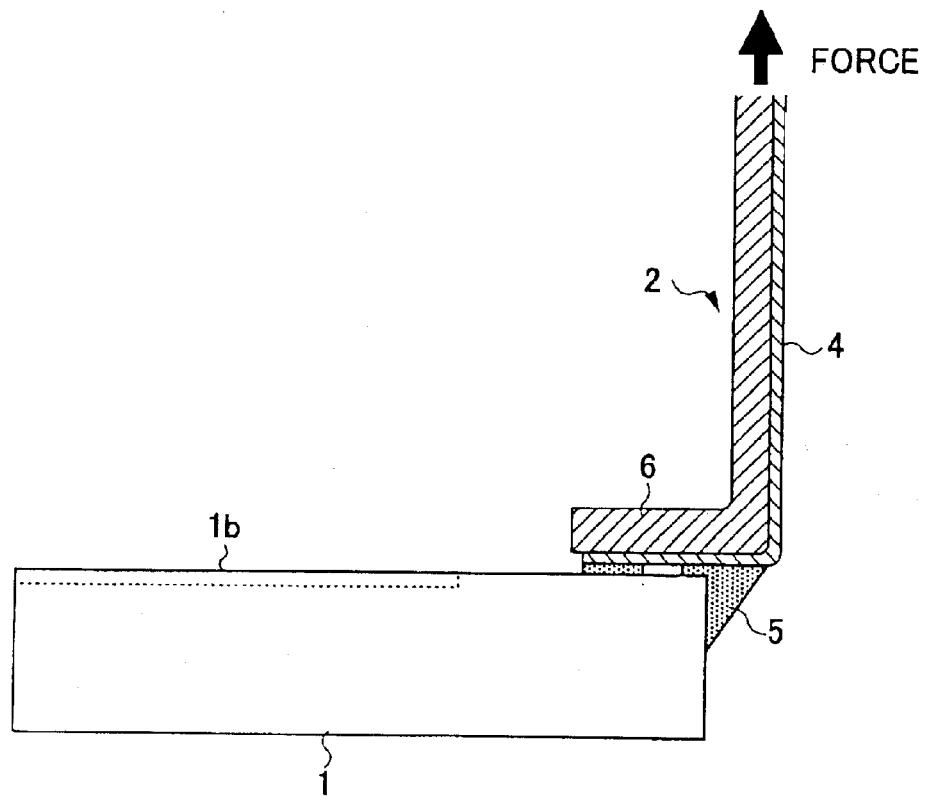
FIG. 12 is an illustration for explaining an effect of the fillet configuration part.
Figure 13:
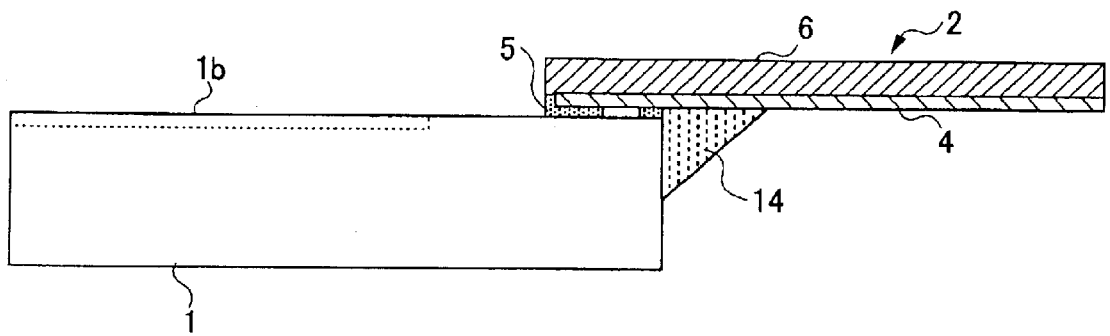
FIG. 13 is a side view of a fillet configuration part formed by a protective resin.

It should be noted that, in the above-mentioned embodiment, a filet configuration part of the anisotropically conductive resin 5 (or nonconductive paste) may be formed at a corner formed by the semiconductor chip 1 and the flexible board 2 as shown in FIG. 11. By forming such a fillet configuration part, the flexible board 2 is prevented from separating from the semiconductor chip 1 even if a tension force is applied to the flexible board 2 as shown in FIG. 12. Additionally, a filet configuration part of the protective resin 14, which is different from the anisotropically conductive resin 5, may be formed at the corner formed by the flexible board 2 and the semiconductor chip 1.

The present invention is not limited to the specifically disclosed embodiments, and variations and modifications may be made without departing from the scope of the present invention.

What is claimed is:

1. A semiconductor device having a built-in contact-type sensor, comprising:

a semiconductor element including a built-in contact-type sensor having a sensor area formed on a circuit formation surface and connection terminals provided in an area other than the sensor area;

a wiring board connected to the connection terminals of the semiconductor element so that an end surface of the wiring board is positioned on said circuit formation surface; and a protective resin part covering a part extending from the end surface of said wiring board to said circuit formation surface.

2. A semiconductor device having a built-in contact-type sensor, comprising:

a semiconductor element including a built-in contact-type sensor having a sensor area formed on a circuit formation surface and connection terminals provided in an area other than the sensor area;

a wiring board connected to the connection terminals of the semiconductor element so that an end surface of the wiring board is positioned on said circuit formation surface; and a resin filled between said wiring board and said semiconductor element and covering said end surface of the wiring board.

3. A semiconductor device having a built-in contact-type sensor, comprising:

a semiconductor element including a built-in contact-type sensor having a sensor area formed on a circuit formation surface and connection terminals provided in an area other than the sensor area; and a wiring board connected to the connection terminals of the semiconductor element so that an end surface of the wiring board is positioned on said circuit formation surface, wherein said end surface of the wiring board positioned on said circuit formation surface forms an inclined surface with respect to said circuit formation surface.

4. The semiconductor device having a built-in contact-type sensor as claimed in claim 3, wherein a conductive part is formed in the vicinity of said oblique surface on a surface opposite to a surface of said wiring board facing said semiconductor element, and the conductive part is electrically connected to grounding wires included in wires formed on said wiring board.

5. A semiconductor device having a built-in contact-type sensor, comprising:

a semiconductor element including a built-in contact-type sensor having a sensor area formed on a circuit formation surface and connection terminals provided in an area other than the sensor area; and a wiring board having wires on a surface facing the semiconductor element and connected to the connection terminals of the semiconductor element so that an end surface of the wiring board is positioned on said circuit formation surface, wherein a conductive part is formed in the vicinity of said end surface of said wiring board on a surface opposite to the surface of said wiring board facing said semiconductor element, and the conductive part is electrically connected to grounding wires included in the wires formed on said wiring board.

* * * * *